(12) United States Patent
Broker

(10) Patent No.: US 9,927,783 B2
(45) Date of Patent: Mar. 27, 2018

(54) ANALOG SIGNAL PROCESSING USING A CORRELATOR DIGITAL FILTER

(71) Applicant: Emerson Electric Co., St. Louis, MO (US)

(72) Inventor: John Broker, Warrenton, MO (US)

(73) Assignee: Emerson Electric Co., St. Louis, MO (US)

( * ) Notice: Subject to any disclaimer, the term of this patent is extended or adjusted under 35 U.S.C. 154(b) by 627 days.

(21) Appl. No.: 14/486,597

(22) Filed: Sep. 15, 2014

(65) Prior Publication Data

US 2016/0077502 A1   Mar. 17, 2016

(51) Int. Cl.
*G05B 15/02* (2006.01)
*H03H 17/02* (2006.01)

(52) U.S. Cl.
CPC ......... *G05B 15/02* (2013.01); *H03H 17/0248* (2013.01); *G05B 2219/2642* (2013.01)

(58) Field of Classification Search
CPC ............ G05B 15/02; G05B 2219/2642; H03H 17/0248
USPC .......................................................... 700/90
See application file for complete search history.

(56) References Cited

U.S. PATENT DOCUMENTS

| | | | |
|---|---|---|---|
| 3,950,635 A * | 4/1976 | Constant ................... | G06F 5/10 708/314 |
| 4,766,563 A | 8/1988 | Fujimoto | |
| 5,255,202 A | 10/1993 | Kido et al. | |
| 7,006,206 B2 | 2/2006 | Jones et al. | |
| 7,791,515 B2 | 9/2010 | Fifield | |
| 7,852,908 B1 | 12/2010 | Norman | |
| 8,014,964 B1 | 9/2011 | Khalsa | |
| 8,805,554 B1 | 8/2014 | Latham, II et al. | |
| 2002/0008506 A1 | 1/2002 | Nakada et al. | |
| 2008/0069270 A1 | 3/2008 | Tyra et al. | |
| 2009/0009128 A1 | 1/2009 | Okita et al. | |
| 2010/0070217 A1 * | 3/2010 | Shimada ................ | G01D 4/008 702/62 |
| 2010/0117625 A1 * | 5/2010 | Botts ...................... | G01R 22/10 324/103 R |
| 2010/0207743 A1 | 8/2010 | Jackson et al. | |
| 2014/0107850 A1 | 4/2014 | Curtis | |
| 2014/0249654 A1 | 9/2014 | Blevins et al. | |

OTHER PUBLICATIONS

International Search Report and Written Opinion of the International Searching Authority regarding PCT/US2015/049992 dated Nov. 18, 2015;.

* cited by examiner

*Primary Examiner* — Yuhui R Pan
(74) *Attorney, Agent, or Firm* — Armstrong Teasdale LLP

(57) ABSTRACT

A control system for controlling operation of an electric appliance is provided. The control system includes a correlator digital filter configured to receive input signals including at least one target signal associated with operation of the electric appliance and extract the target signal from the input signal. The control system also includes a controller operatively coupled with the correlator digital filter and the electric appliance, where the controller is configured to receive the extracted target signal from the correlator digital filter.

14 Claims, 5 Drawing Sheets

ANALOG SIGNAL PROCESSING USING A CORRELATOR DIGITAL FILTER

BACKGROUND

The field relates generally to signal processing, and more specifically to processing an analog signal using a correlator digital filter.

In general, an analog signal is a continuous signal that is representative of a physical characteristic of the corresponding system. In electronics, the system may be an electric circuit, and the analog signal is obtained by taking measurements using sensors, probes, or other similar devices. Moreover, the measured analog signal is representative of the voltage, current, or other characteristics of the circuit.

Oftentimes, a measured analog signal will also include noise or other distortions. Noise is a random fluctuation in a signal and is a product of several phenomena (e.g., electromagnetic radiation, thermal energy, defects in the conduction media, etc.). Depending on the amount of noise in the signal (typically referenced as a signal-to-noise ratio) it may be difficult to distinguish the measured physical characteristic of the circuit. It would be beneficial to extract an underlying signal associated with the measured characteristic from an analog signal that includes noise and/or other distortions.

BRIEF DESCRIPTION

In one embodiment, a control system for controlling operation of an electric appliance is provided. The control system includes a correlator digital filter configured to receive input signals including at least one target signal associated with operation of the electric appliance and extract the target signal from the input signal. The control system also includes a controller operatively coupled with the correlator digital filter and the electric appliance, where the controller is configured to receive the extracted target signal from the correlator digital filter.

In another embodiment, an electric appliance is provided. The electric appliance includes at least one sensor for generating an input signal including at least one target signal associated with the operation of the electric appliance. The electric appliance also includes a control system. The control system includes a correlator digital filter operatively coupled with the sensor and configured to extract the target signal from the input signal. The control system also includes a controller operatively coupled with the correlator digital filter and the electric appliance, where the controller is configured to receive the target signal from the correlator digital filter.

In yet another embodiment, a method for extracting at least one target signal using a control system including a correlator digital filter is provided. The method includes receiving, by the control system, an input signal from a sensor, where the input signal includes the target signal. The method also includes correlating, by the correlator digital filter, the input signal with a reference signal to extract a portion of the input signal that correlates with the target signal.

DETAILED DESCRIPTION

The embodiments described herein generally relate to analog signal processing. More specifically, the embodiments described herein relate to methods and systems for processing an analog signal using a correlator digital filter.

A correlator is a digital filter used to detect the presence of a known signal in an unknown signal. More specifically, a correlator is a digital filter configured to detect a target signal (the known signal) in an input signal (the unknown signal) by receiving the input signal, correlating a reference signal of a known frequency with the input signal (the known frequency of the reference signal matching the frequency of the target signal), and outputting a portion of the input signal that correlates with the target signal at the known frequency.

As used herein, the term "signal" refers to an analog or digital signal. In some embodiments, a signal may include one or more additional signals, e.g., as a plurality of signals superimposed on each other. For example, a signal obtained by measuring an electronic circuit may include a voltage signal, a current signal, and/or a noise signal.

Figure 1:
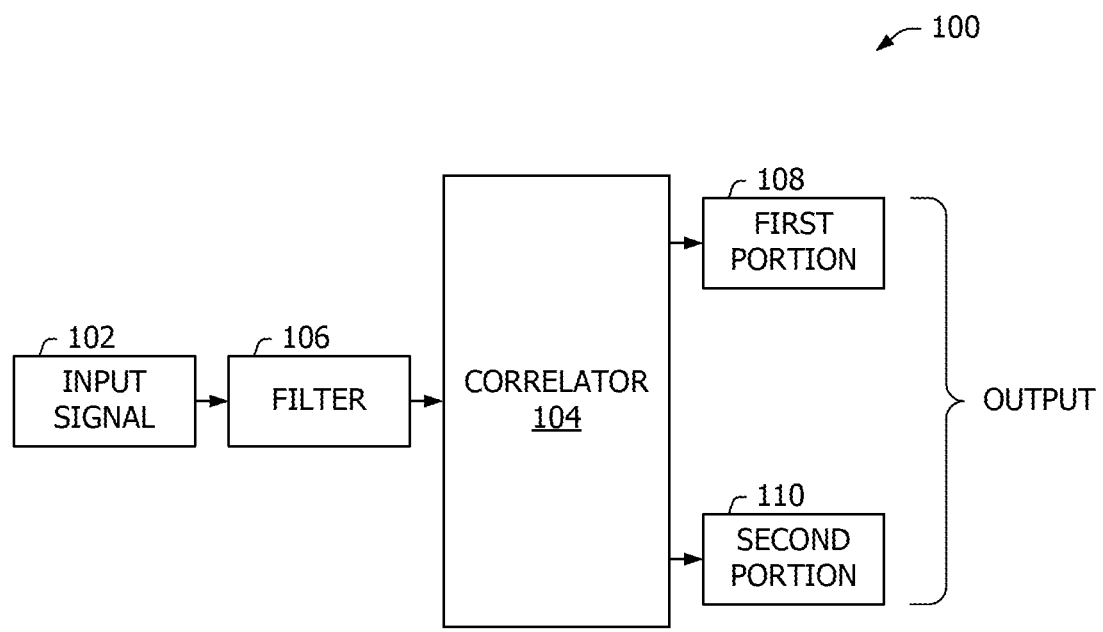
FIG. 1 is a block diagram of an example computing system for processing an analog signal using a correlator digital filter.

FIG. 1 is a block diagram of an example computing system 100 for processing an analog signal using a correlator digital filter. Example computing system 100 receives an input signal 102. Computing system 100 includes a correlator 104 configured to receive input signal 102 and correlate input signal 102 to a target signal (not shown). In the example embodiment, input signal 102 is an analog signal (sometimes referred to as a continuous signal), such as a voltage and/or current signal, and may be received from a sensor coupled with, or in communication with, system 100. In some embodiments, input signal 102 includes noise and/or other distortions (e.g., generated by or existing in the environment of system 100). In the example embodiment, system 100 includes a filter 106 coupled with correlator 104 to filter input signal 102. Alternatively, filter 106 may be an embedded component of correlator 104.

In the example embodiment, correlator 104 is configured to extract those portions of input signal 102, if any, that correlate with a sinusoidal target signal (not shown). More specifically, correlator 104 is configured to extract a first portion 108 and a second portion 110 of the sinusoidal target signal from input signal 102. First portion 108 is associated with a sine portion of the sinusoidal target signal, and second portion 110 is associated with a cosine portion of the sinusoidal target signal. In some embodiments, input signal 102 may not include the target signal, such that first portion 108 and second portion 110 may be zero, null, or otherwise nonexistent. In other embodiments, correlator 104 may be configured to accept a plurality of input signals, and may be configured to correlate and output a plurality of target signals from one or more of the plurality of input signals.

In the example embodiment, correlator 104 is used to extract a target signal from input signal 102 when signal 102 includes noise and/or other distortions. Noise may make it difficult to distinguish the target signal from input signal 102. During operation, correlator 104 operates to normalize and/or scale the sinusoidal portions of input signal 102 that correlate with the target signal. Noise is entropic and typically not sinusoidal, therefore correlator 104 also operates to output the target signal separately from noise. Additional signals carried in input signal 102 are similarly ignored when the period and/or frequency of these signals differs from the target signal. In some embodiments, correlator 104 further operates to remove any offset (e.g., a DC offset voltage) applied to input signal 102.

In some embodiments, computing system 100 is used to determine the electrical power consumed by a device (not shown) coupled with an AC power source (not shown). Input signal 102 includes measurements related to power provided to the device. Specifically, input signal 102 includes signals associated with the voltage, current, and noise. Correlator 104 extracts the voltage and current signals from input signal 102. The electrical power consumed by the device is determined using the extracted voltage and current waveform.

Figure 2:
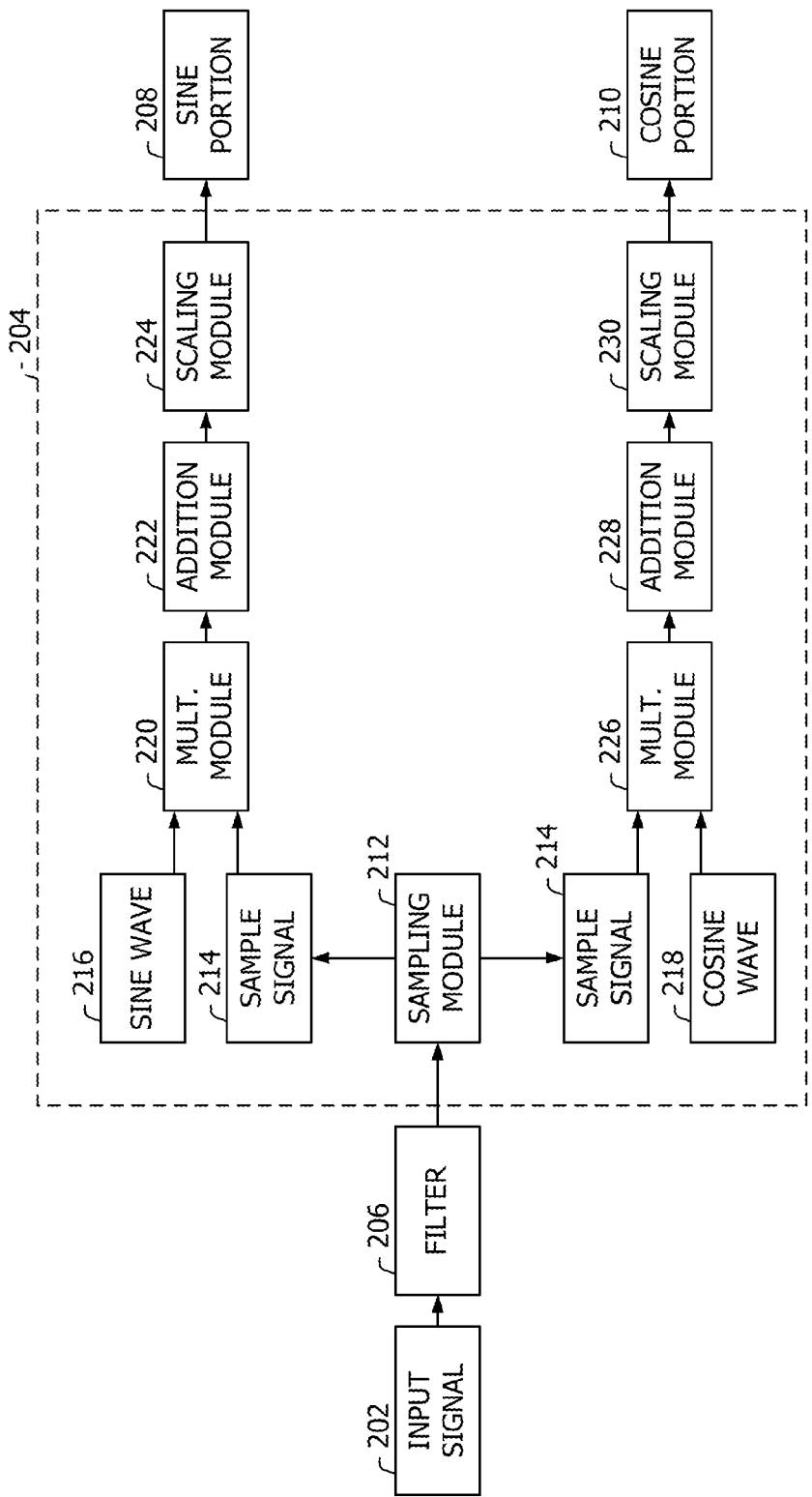
FIG. 2 is a block diagram of an example correlator digital filter that may be used in the system shown in FIG. 1.

FIG. 2 is a block diagram of system 100 including an example correlator digital filter 204. Correlator 204 receives an input signal 202 via a filter 206. In the example embodiment, correlator 204 is described with respect to extract voltage and/or current signals for use in determining a power consumption of a device (not shown). Alternatively, system 100 may be used to extract a signal from any suitable input for any suitable purpose. In the example embodiment, input signal 202 is obtained by measuring an analog signal at a point between a power source and a device. Input signal 202 includes signals representing the voltage supplied to the device, the current supplied to the device, and a noise component.

In determining the electrical power consumed by the device, a target signal is identified that correlates with a reference signal associated with the expected voltage and/or current signal produced by the power source. In the example embodiment, the expected signal is sinusoidal with a known frequency, generally 60 Hz or 50 Hz depending on location. The target signal includes a voltage signal and a current signal, the voltage signal correlating with the voltage provided to the device and the current signal correlating with the current supplied to the device. Correlator 204 is configured to extract the identified target signal from input signal 202. In the example embodiment, correlator 204 extracts a sine portion 208 and a cosine portion 210 from input signal 202 from each of the voltage signal and the current signal.

Correlator 204 includes a sampling module 212 to enable correlator 204 to sample input signal 202 at a specified frequency over one or more sampling period. The sampling period is a number representing the duration of time over which input signal 202 is sampled (e.g., in seconds) by sampling module 212. The specified frequency is a number representing the number of samples taken by sampling module 212 during one sampling period (e.g., 10 samples per sampling period). Sampling module 212 may include any combination of software, hardware, or both to enable correlator 204 to function as described herein. Sample signal 214 includes a plurality of samples (not shown) according to the specified frequency and the sampling period.

Correlator 204 extracts the target signal by correlating a reference signal with sample signal 214 for each portion of the target signal. In the example embodiment, a sine wave 216 is correlated with signal 214 to extract sine portion 208 of the target signal, and a cosine wave 218 is correlated with signal 214 to extract cosine portion 210 of the target signal. Correlator 204 may receive sine wave 216 and cosine wave 218 from a sine function or cosine function, a lookup table, or by any other suitable method.

Correlator 204 includes a multiplication module 220, an addition module 222, and a scaling module 224 for extracting sine portion 208. For each sample during the one or more sampling period, multiplication module 220 multiplies samples of signal 214 with corresponding samples of sine wave 216, addition module 222 adds the products, and scaling module 224 scales the sum to obtain sine portion 208. Similarly, correlator 204 includes a multiplication module 226, an addition module 228, and a scaling module 230 for extracting cosine portion 210. For each sample during the one or more sampling period, multiplication module 226 multiplies samples of signal 214 with corresponding samples of cosine wave 218, addition module 228 adds the products, and scaling module 230 scales the sum to obtain cosine portion 210. Sine portion 208 and cosine portion 210 are combined to obtain the voltage signal and the current signal of the target signal.

Figure 3:
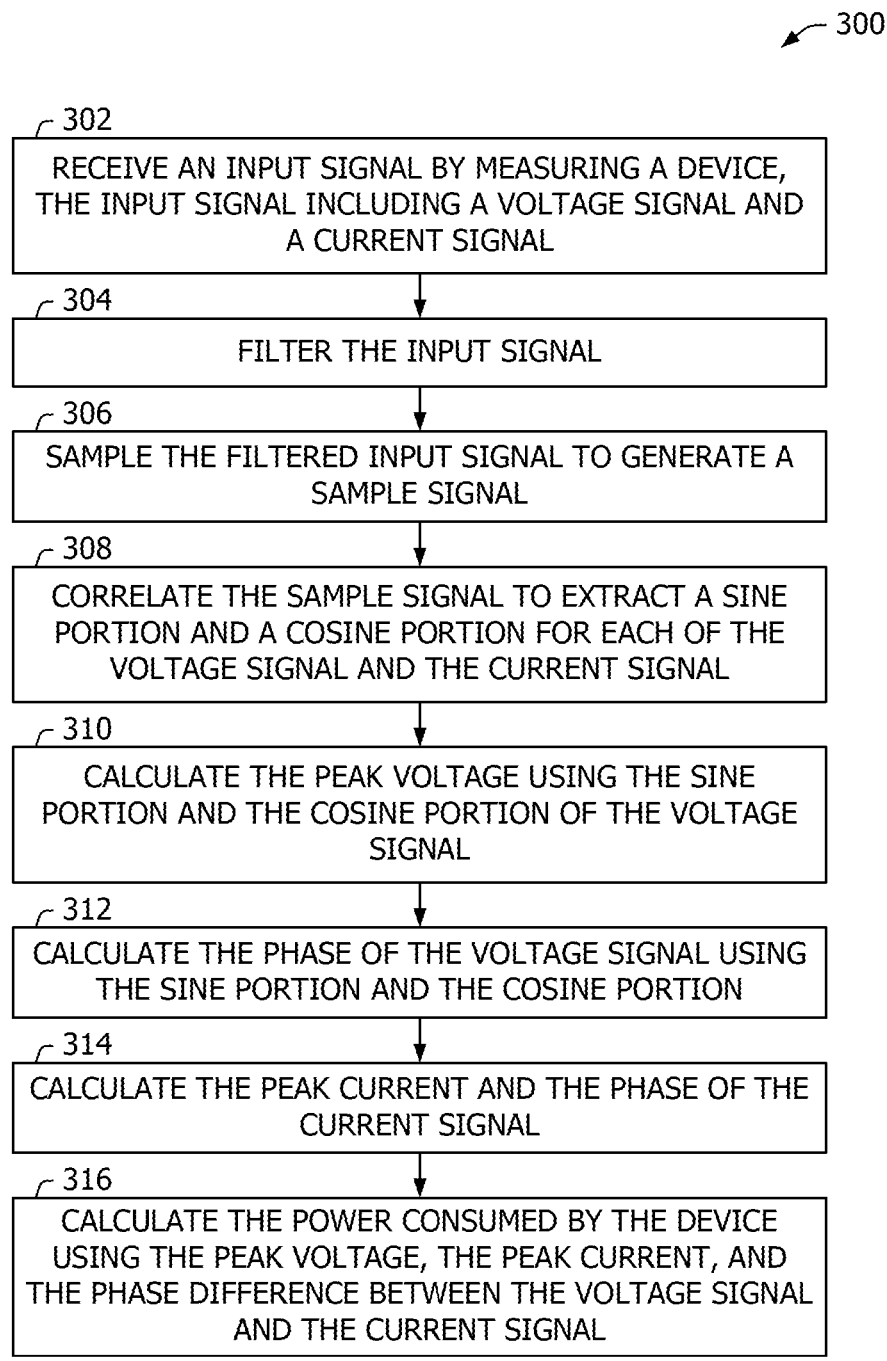
FIG. 3 is a flow diagram for calculating power consumed by a device.

FIG. 3 is a flow diagram illustrating an example method 300 for calculating power consumed by a device in accordance with an example embodiment of the present disclosure. In the example embodiment, method 300 is performed digitally, and is implemented using a correlator digital filter (e.g., correlator 204 shown in FIG. 2). The correlator digital filter is used to obtain a voltage signal and a current signal from an input signal measured from the device, where the voltage signal and the current signal each include a sine portion and a cosine portion. The input signal is expressed generally by equation (1), where $T_s$ is the sample period, $\omega$ is the angular frequency of the input signal, and $\theta$ is the phase of the input signal.

$$X_i = A \cdot \sin[\omega \cdot (i \cdot T_s) + \theta] \qquad (1)$$

During operation, the sine portion and the cosine portion of the voltage and current signals are determined. The input signal is received 302 the by the correlator, filtered 304 using a filter coupled with the correlator, and sampled 306 to generate a sample signal. The sample signal is correlated 308 with a sine wave to determine the sine portion of the sample signal as expressed by equation (2), where N is the number of periods sampled, $N_T$ is the number of samples per period, $T_s$ is the sample period, and $X_i$ is the sample signal expressed by equation (1).

$$\text{Sine Portion} = \frac{2}{N \cdot T} \sum_{i=1}^{N_T \cdot N} [X_i \cdot \sin[\omega \cdot (i \cdot T_s)] \cdot T_s] \qquad (2)$$

The sample signal is also correlated 308 with a cosine wave to determine the cosine portion of the sample signal as expressed by equation (3), where N is the number of periods sampled, $N_T$ is the number of samples per period, $T_s$ is the sample period, and $X_i$ is the sample signal expressed by equation (1).

$$\text{Cosine Portion} = \frac{2}{N \cdot T} \sum_{i=1}^{N_T \cdot N} [X_i \cdot \cos[\omega \cdot (i \cdot T_s)] \cdot T_s] \qquad (3)$$

The peak voltage is determined by calculating 310 the square root of the sum of the squares of the sine portion and the cosine portion associated with the voltage signal as expressed by equation (4).

$$\text{Peak} = \sqrt{(\text{SinePortion})^2 + (\text{CosinePortion})^2} \quad (4)$$

The phase of the voltage signal is determined by calculating 312 the inverse tangent of the quotient obtained by dividing the sine portion by the cosine portion as expressed by equation (5).

$$\varphi = \operatorname{atan}(\text{Sine Portion}/\text{Cosine Portion}) \quad (5)$$

The peak current and phase of the current signal are similarly calculated 314 using equations (4) and (5) with the sine portion and the cosine portion of the current signal.

The power consumed by the device is determined by calculating 316 the product of one half times the peak voltage times the peak current times the cosine of the difference of the phase of the voltage signal and the phase of the current signal as expressed by equation (6), where θ is the phase of the voltage signal, and φ is the phase of the current signal.

$$\text{Power} = \left(\frac{1}{2}\right) \cdot \text{Peak}_{Voltage} \cdot \text{Peak}_{Current} \cdot \cos(\theta - \phi) \quad (6)$$

In some embodiments, method 300 may be performed using analog circuitry by replacing equations (1)-(3) with equations (7)-(9). The input signal is expressed generally by equation (7), where ω is the angular frequency of the input signal, and θ is the phase of the input signal. The sine portion of the sample signal is expressed by equation (8), where N is the number of periods sampled, T is the sample period, and X(t) is the sample signal expressed by equation (7). The cosine portion of the sample signal is expressed by equation (9), where N is the number of periods sampled, T is the sample period, and X(t) is the sample signal expressed by equation (7).

$$X(t) = A \cdot \sin(\omega \cdot t + \theta) \quad (7)$$

$$\text{Sine Portion} = \frac{2}{N \cdot T} \int_{t_0}^{t_0 + N \cdot T} X(t) \cdot \sin(\omega \cdot t) \, dt \quad (8)$$

$$\text{Cosine Portion} = \frac{2}{N \cdot T} \int_{t_0}^{t_0 + N \cdot T} X(t) \cdot \cos(\omega \cdot t) \, dt \quad (9)$$

Figure 4:
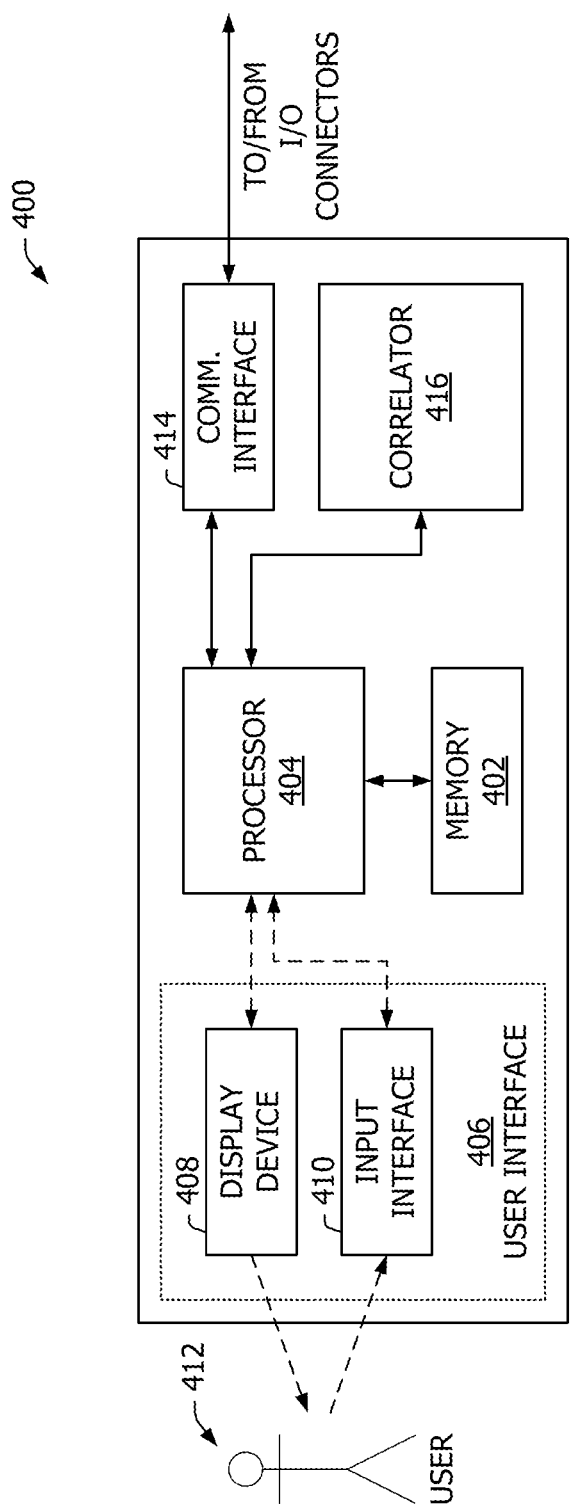
FIG. 4 is a block diagram of an example computing device for use in the system shown in FIG. 1.

FIG. 4 is a block diagram of an example computing device 400 for use in system 100 shown in FIG. 1. Computing device 400 includes at least one memory device 402 and a processor 404 coupled to memory device 402. In the example embodiment, memory device 402 stores executable instructions that, when executed by processor 404, enable computing device 400 to perform one or more operations described herein. In some embodiments, processor 404 may be programmed by encoding an operation as one or more executable instructions and providing the executable instructions in memory device 402.

Processor 404 may include one or more processing units (e.g., in a multi-core configuration). Further, processor 404 may be implemented using one or more heterogeneous processor systems in which a main processor is present with secondary processors on a single chip. As another example, processor 404 may be a symmetric multi-processor system containing multiple processors of the same type. Further, processor 404 may be implemented using any suitable programmable circuit including one or more systems and microcontrollers, microprocessors, programmable logic controllers (PLCs), reduced instruction set circuits (RISCs), application specific integrated circuits (ASICs), programmable logic circuits, field programmable gate arrays (FPGAs), and any other circuit capable of executing the functions described herein. Further, processor 404 may include an internal clock to monitor the timing of certain events, such as a sampling period and/or a sampling frequency. In the example embodiment, processor 404 determines when to sample input signal 202 (shown in FIGS. 1 and 2), and controls the calculations performed on the relative samples.

Memory device 402 is one or more devices that enable information such as executable instructions and/or other data to be stored and retrieved. Memory device 402 may include one or more computer readable media, such as, dynamic random access memory (DRAM), static random access memory (SRAM), a solid state disk, and/or a hard disk. Memory device 402 may be configured to store application source code, application object code, source code portions of interest, object code portions of interest, configuration data, execution events and/or any other type of data.

In some embodiments, computing device 400 includes a user interface 406 that includes a display device (broadly, a presentation interface) 408 and an input interface 410. Display device 408 is coupled with processor 404, and presents information, such as user-configurable settings, to a user 412, such as a technician. Display device 408 may include any suitable display device that enables the computing device 400 to function as described herein, such as, for example, a cathode ray tube (CRT), a liquid crystal display (LCD), an organic light emitting diode (OLED) display, an LED matrix display, and an "electronic ink" display. Further, display device 408 may include more than one display device.

Input interface 410 is coupled with processor 404 and is configured to receive input from user 412. Input interface 410 may include a plurality of push buttons that allow a user to cycle through user-configurable settings and/or user-selectable options corresponding to the settings. Alternatively, input interface 410 may include any suitable input device that enables computing device 400 to function as described herein, such as, for example, a keyboard, a pointing device, a mouse, a stylus, a touch sensitive panel (e.g., a touch pad or a touch screen), a gyroscope, an accelerometer, a position detector, and/or an audio interface. Additionally, a single component, such as a touch screen, may function as both display device 408 and input interface 410.

In the example embodiment, computing device 400 also includes a communication interface 414 coupled with processor 404. Communication interface 414 is coupled with one or more input and output connectors (I/O connectors), and enables processor 404 to communicate with one or more components of system 100, other computing devices, and/or components external to system 100.

Computing device 400 further includes a correlator 416 coupled with processor 404. In the example embodiment, correlator 416 is a component of computing device 400. Correlator 416 may be embodied in hardware, software, or a combination of both to enable computing device 400 to function as described herein. In other embodiments, correlator 416 is part of a separate computing device (not shown) in communication with computing device 400 (e.g., using communication interface 414). Correlator 416 enables processor 404 to receive a target signal (e.g., from user 412 using input interface 410), sample an input signal (e.g., received using communication interface 414, or stored by memory device 402), determine the sinusoidal portions of the input signal that correlate with the target signal, and output the sinusoidal portions and/or the target signal (e.g., to user 412 using display device 408, or to I/O connectors using communication interface 414).

Figure 5:
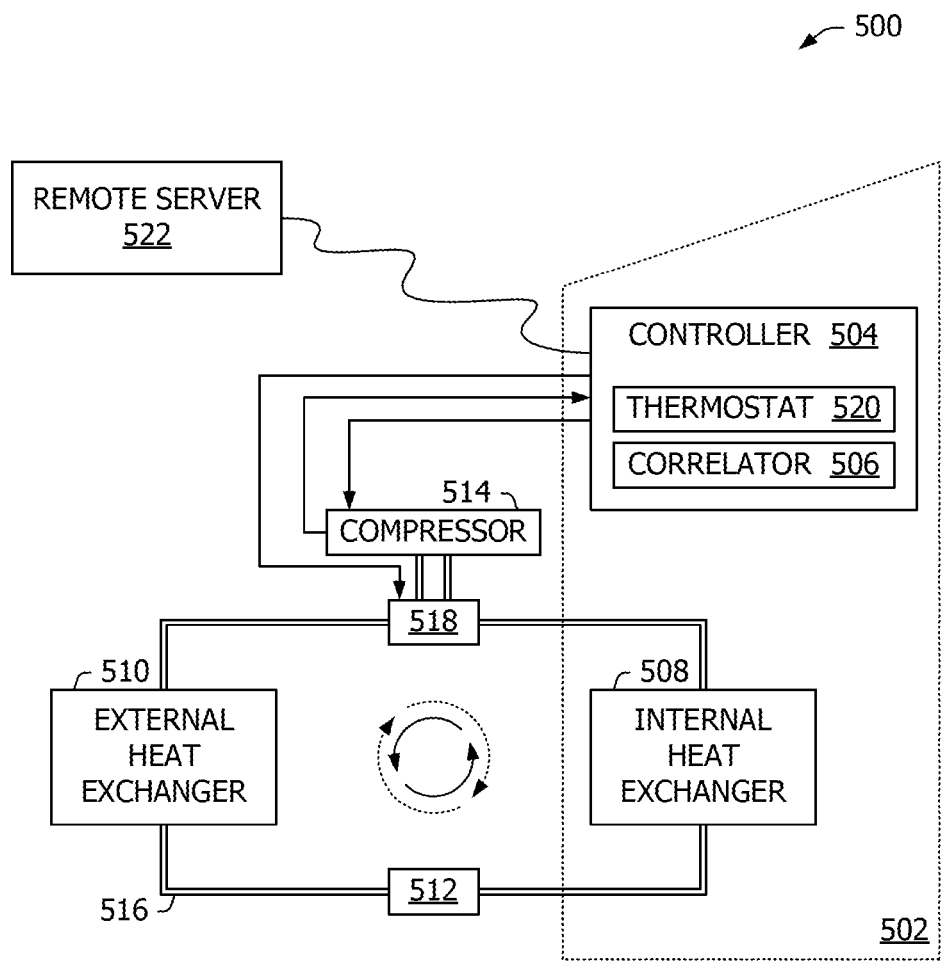
FIG. 5 is a block diagram of an HVAC system including a correlator digital filter.

FIG. 5 is a block diagram of an HVAC system 500 including a correlator digital filter in accordance with one example embodiment of the present disclosure. HVAC system 500 enables heating and cooling a temperature controlled environment 502. System 500 includes a controller 504 coupled with, or in communication with, a correlator 506. In the example embodiment, controller 504 is a computing device such as, for example, computing device 400 shown in FIG. 4. Correlator 506 enables continuous monitoring of power consumption by devices of system 500.

HVAC system 500 also includes an internal heat exchanger 508, an external heat exchanger 510, an expansion device 512 fluidly coupled between heat exchanger 508 and 510, and a compressor 514. External heat exchanger 510, expansion device 512, internal heat exchanger 508, and compressor 514 are coupled in fluid communication by conduits 516.

Refrigerant is circulated through system 500 by compressor 514. Air from temperature controlled environment 502 contacts internal heat exchanger 508 to exchange heat between the refrigerant and environment 502. Similarly, air from the ambient environment outside environment 502 contacts external heat exchanger 510 to exchange heat between the refrigerant and the ambient environment. The direction of refrigerant flow is controlled by a reversing valve 518 coupled in fluid communication between compressor 514 and heat exchangers 508 and 510.

HVAC system 500 further includes a thermostat 520 coupled with, or in communication with, controller 504. Thermostat 520 is also coupled with one or more temperature sensors (not shown) for measuring the temperature of environment 502. In some embodiments, thermostat 520 is located separately from controller 504 and is communicatively coupled with controller 504 by a wired connection, a wireless connection, or any other communication means to enable system 500 to function as described herein.

Operation of HVAC system 500 is generally controlled by controller 504. Controller 504 is coupled with compressor 514, reversing valve 518, and thermostat 520 for controlling operation of the components in response to control signals received from thermostat 520 and/or correlator 506. In some embodiments, controller 504 enables controlling operation of system 500 in response to executable instructions stored in a memory device (e.g., memory device 402 shown in FIG. 4) of controller 504.

During operation, correlator 506 receives one or more input signal from sensors (not shown) coupled with the components. For example, a sensor coupled with compressor 514 may generate an analog signal associated with the voltage and current being supplied to compressor 514. When the component is active, the analog signal is received by correlator 506 and used to determine the power being consumed by compressor 514. In some embodiments, controller 504 may activate, deactivate, or throttle compressor 514 (or another component) based on the power being consumed by the component. Similarly, correlator 506 may be used to control other components of system 500. In other embodiments, controller 504 determines the power being consumed by a component (e.g., compressor 514) using correlator 506, and displays the determined power consumption using controller 504 (e.g., on display device 408 shown in FIG. 4), a display interface (not shown) of compressor 514, a display interface (not shown) of thermostat 520, or using any appropriate device coupled with (or in communication with) system 500 to enable a user (e.g., user 412 shown in FIG. 4) to view the power consumed by the devices of system 500. Moreover, when the determined power consumption for more than one device is displayed, controller 504 enables the display of such consumption for each device individually and/or together (e.g., showing total power consumption for system 500). In yet other embodiments, controller 504 and correlator 506 enable determining the power being consumed by the component in substantially real-time, and further enable the user to view such power consumption in substantially real-time.

In some embodiments, HVAC system 500 also includes a remote server 522 communicatively coupled with controller 504. Controller 504 is configured to communicate with remote server 522 over a network such as a local area network (LAN), a wide area network (WAN), or any other communication architecture to enable system 500 to function as described herein. Remote server 522 is configured to receive power consumption data generated by correlator 506 for the devices of system 500. For example, remote server 522 may be operated by a utility provider (or service provider) and receive power consumption data for a plurality of user accounts, where each user account is associated with a user at a location (e.g., a homeowner and their home). Remote server 522 enables the utility provider to generate energy consumption information for a specified location (e.g., the location of a specified user account) or for a specified grouping of locations (e.g., by street, city, zip code, or other grouping parameter). For a specified grouping of locations, the energy consumption information may be used by the utility provider to determine load shedding patterns as power consumption increases during a given time period. Remote server 522 further enables the utility provider to provide such energy consumption information to a user, e.g., as a value added service to promote energy efficiency or reduction. Such information may inform the user of their energy usage by day, month, year, and/or in comparison to other users, and may be accessible to the user via a website on a web browser or a mobile application resident on a mobile device.

Embodiments of the methods and systems described herein enable an underlying signal to be extracted from an analog signal using a correlator digital filter when the analog signal includes noise, distortion, and/or other signals. For example, in calculating power consumption of an electrical device, an analog signal may be obtained that includes a voltage signal, a current signal, and a noise signal. Unlike known methods, a correlator digital filter may extract the voltage signal and the current signal from the analog signal so that the power may be calculated despite the noise.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A control system for controlling operation of a heating ventilation and air conditioning (HVAC) system including a component, the control system comprising:
    a correlator digital filter configured to receive input signals including at least one target signal associated with operation of the component of the HVAC system and extract the target signal from the input signal, wherein the correlator digital filter extracts the target signal by correlating the input signal with a reference signal of a known frequency that matches the frequency of the target signal, and outputting a portion of the input signal that correlates with the target signal at the known frequency; and a controller operatively coupled with the correlator digital filter and the component, wherein the controller is configured to receive the extracted target signal from the correlator digital filter, and control the component of the HVAC system based at least in part on the extracted target signal from the correlator filter, wherein the input signal is analog, and includes the target signal and noise, and the correlator digital filter is configured to remove the noise from the input signal to extract the target signal.

2. The control system of claim 1, wherein the target signal is substantially sinusoidal.

3. The control system of claim 1, wherein the at least one target signal comprises a voltage signal and a current signal, wherein the voltage signal represents a voltage supplied to the component and the current signal represents a current supplied to the component.

4. The control system of claim 3, wherein the controller is further configured to determine a power consumption of the component based at least in part on the voltage signal and the current signal.

5. The control system of claim 4, wherein the controller is configured to control the HVAC system based at least in part on the determined power consumption of the component.

6. An electric appliance comprising:
at least one sensor for generating an input signal including at least one target signal associated with the operation of the electric appliance; and
a control system comprising:
a correlator digital filter operatively coupled with the sensor and configured to extract the target signal from the input signal, wherein the correlator digital filter extracts the target signal by correlating the input signal with a reference signal of a portion of the input signal that correlates with the target signal at the known frequency; and
a controller operatively coupled with the correlator digital filter and the electric appliance, wherein the controller is configured to receive the target signal from the correlator digital filter, to control the electric appliance based at least in part on the target signal, wherein the input signal is analog, and includes the target signal and noise, and the correlator digital filter is configured to remove the noise from the input signal to extract the target signal.

7. The electric appliance of claim 6, wherein the target signal is substantially sinusoidal.

8. The electric appliance of claim 6, wherein the at least one target signal comprises a voltage signal and a current signal, wherein the voltage signal represents a voltage supplied to the electric appliance and the current signal represents a current supplied to the electric appliance.

9. The electric appliance of claim 8, wherein the controller is further configured to determine a power consumption of the electric appliance based at least in part on the voltage signal and the current signal.

10. The electric appliance of claim 9, wherein the controller is further configured to control the electric appliance based at least in part on the determined power consumption of the electric appliance.

11. A method for controlling an electric appliance, the method comprising:
receiving, by a control system, an input signal from a sensor associated with the electric appliance, wherein the input signal includes the target signal;
correlating, by a correlator digital filter, the input signal with a reference signal of a known frequency to extract a portion of the input signal that correlates with the target signal, wherein the known frequency of the reference signal matches the frequency of the target signal; and
controlling, by the control system, the electric appliance based at least in part on the extracted portion of the input signal that correlates with the target signal;
wherein the input signal is analog, and includes the target signal and noise, and the correlator digital filter is configured to remove the noise from the input signal to extract the target signal.

12. The method of claim 11, further comprising sampling the input signal by the correlator digital filter to generate a sample signal.

13. The method of claim 12, further comprising correlating the sample signal with the reference signal by the correlator digital filter to extract a portion of the sample signal that correlates with the target signal.

14. The method of claim 11, further comprising correlating, by the correlator digital filter, the input signal with an additional reference signal to extract a portion of the input signal that correlates with an additional target signal.

* * * * *